United States Patent
Ma et al.

(10) Patent No.: US 10,233,539 B2
(45) Date of Patent: Mar. 19, 2019

(54) VAPOR DEPOSITION APPARATUS

(71) Applicant: BOE TECHNOLOGY GROUP CO., LTD., Beijing (CN)

(72) Inventors: Lifei Ma, Beijing (CN); Peng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/436,053

(22) PCT Filed: Aug. 28, 2014

(86) PCT No.: PCT/CN2014/085383
§ 371 (c)(1),
(2) Date: Apr. 15, 2015

(87) PCT Pub. No.: WO2015/165183
PCT Pub. Date: Nov. 5, 2015

(65) Prior Publication Data
US 2017/0037508 A1    Feb. 9, 2017

(30) Foreign Application Priority Data

Apr. 30, 2014  (CN) .......................... 2014 1 0182185

(51) Int. Cl.
*C23C 16/04* (2006.01)
*C23C 16/458* (2006.01)
(Continued)

(52) U.S. Cl.
CPC .......... *C23C 16/042* (2013.01); *C23C 14/042* (2013.01); *C23C 14/24* (2013.01); *C23C 16/458* (2013.01); *H01L 51/56* (2013.01)

(58) Field of Classification Search
CPC ........................... C23C 14/042; C23C 16/042
See application file for complete search history.

(56) References Cited

U.S. PATENT DOCUMENTS

2010/0273387 A1* 10/2010 Inoue .................... C23C 14/042
                                                            445/58
2012/0204794 A1*  8/2012 Ko .......................... C23C 14/12
                                                            118/721
2013/0001602 A1   1/2013 Park et al.

FOREIGN PATENT DOCUMENTS

CN        1426118       6/2003
CN        1786753       6/2006
(Continued)

OTHER PUBLICATIONS

Decision on Rejection in Chinese Application No. 201410182185.2 dated Mar. 17, 2017, with English translation. 10 pages.
International Search Report and Written Opinion with English Language Translation, dated Jan. 21, 2015, Application No. PCT/CN2014/082117.
(Continued)

*Primary Examiner* — Parviz Hassanzadeh
*Assistant Examiner* — Nathan K Ford
(74) *Attorney, Agent, or Firm* — Womble Bond Dickinson (US) LLP

(57) ABSTRACT

Disclosed is a vapor deposition apparatus comprising an adsorption apparatus disposed in a vapor deposition cavity, wherein the adsorption apparatus comprising: a plurality of magnetic blocks arranged in a matrix disposed on a side of a substrate to be vapor deposited away from a metal mask plate, and a towing apparatus for adjusting each of the magnetic blocks to move up and down relative to the substrate to be vapor deposited. Such a vapor deposition apparatus may cause the metal mask plate to closely fit the substrate to be vapor deposited, such that a correct pattern will be formed when sub-pixel units are vapor deposited, and cause the magnetic fields of all the magnetic blocks to tend to be consistent, avoiding affecting the above-mentioned pattern by a deformation of the metal mask plate due to the inhomogeneity of the magnetic fields.

8 Claims, 4 Drawing Sheets

(51) Int. Cl.
    *H01L 51/56*     (2006.01)
    *C23C 14/24*     (2006.01)
    *C23C 14/04*     (2006.01)

(56) References Cited

FOREIGN PATENT DOCUMENTS

| | | | |
|---|---|---|---|
| CN | 102212778 | 10/2011 | |
| CN | 101620290 | 3/2012 | |
| CN | 202530152 | 11/2012 | |
| CN | 103116428 | 5/2013 | |
| CN | 103441138 | 12/2013 | |
| CN | 203414701 | 1/2014 | |
| CN | 203466191 | 3/2014 | |
| CN | 103981491 | 8/2014 | |
| CN | 203807547 | 9/2014 | |
| CN | 203883008 | 10/2014 | |
| JP | 2004-259598 | * 9/2004 | ............ C23C 14/04 |
| KR | 101107181 | 1/2012 | |

OTHER PUBLICATIONS

Chinese Office Action with English Language Translation, dated Nov. 3, 2015, Chinese Application No. 201410182185.2.
International Search Report and Written Opinion with English Language Translation, dated Feb. 2, 2015, Application No. PCT/CN2014/085383.
Chinese Office Action with English Language Translation, dated Nov. 2, 2016, Chinese Application No. 201410182185.2.
Chinese Office Action with English Language Translation dated May 4, 2016, Chinese Application No. 201410182185.2.
Office Action received for Chinese Patent Application No. 201410182185.2, dated Jan. 19, 2018, 13 pages (8 pages of English Translation and 5 pages of Office Action).
International Preliminary Report on Patentability received for PCT Patent Application No. PCT/CN2014/085383, dated Nov. 10, 2016, 14 pages (9 pages of English Translation and 5 pages of Original Document).
"Decision on Reexamination," CN Application No. 201410182185.2 (dated Apr. 28, 2018).

* cited by examiner

VAPOR DEPOSITION APPARATUS

FIELD OF THE INVENTION

The disclosure relates to a manufacturing equipment in the field of display technology, and in particular, to a vapor deposition apparatus.

BACKGROUND OF THE INVENTION

An organic light emitting diode (OLED) is an organic thin-film electroluminescent device, which has the advantages of easily forming a flexible structure and a wide viewing angle, etc.; therefore, the display technology utilizing an organic light emitting diode has become an important display technology.

The full color display of an OLED generally comprises ways in which the R (red), G (green) and B (blue) sub-pixels emit light independently, or a white light OLED is combined with a color filter film, or the like. Therein, that the RGB sub-pixels emit light independently is a color mode currently most adopted, which utilizes organic light emitting materials in the sub-pixel units to emit light independently.

Nowadays, an organic light emitting material layer is generally formed by vacuum evaporation coating of the organic material. Therein, for an OLED in which the RGB sub-pixels emit light independently, since each RGB sub-pixel unit employs a different organic light emitting material, the organic light emitting layers of the RGB sub-pixel units need to be vapor deposited, respectively, and in this procedure, a metal mask plate is generally employed, such that its open areas are aligned with areas of the sub-pixels to vapor deposit light emitting materials of different colors in areas of different sub-pixels.

However, since the metal mask plate is relatively thin, generally only tens of microns thick, and is very easily deformed, which will in actual use inevitably result in looseness of the fitting of it to a substrate to be vapor deposited, such that a correct pattern can not be formed when the organic light emitting materials are vapor deposited.

SUMMARY OF THE INVENTION

An object of the disclosure is to provide a vapor deposition apparatus capable of overcoming the above-mentioned drawbacks. According to an aspect of the disclosure, there is provided a vapor deposition apparatus comprising: a vapor deposition cavity, a vapor deposition source disposed in the vapor deposition cavity, a mask plate supporting frame and a substrate supporting frame, wherein the mask plate supporting frame is used for bearing a metal mask plate, the substrate supporting frame is used for bearing a substrate to be vapor deposited, and the metal mask plate is disposed between the vapor deposition source and the substrate to be vapor deposited; the vapor deposition apparatus further comprises an adsorption apparatus disposed in the vapor deposition cavity, the adsorption apparatus comprising: a plurality of magnetic blocks arranged in a matrix disposed on a side of the substrate to be vapor deposited away from the metal mask plate, and a towing apparatus for adjusting each magnetic block to move up and down relative to the substrate to be vapor deposited.

The vapor deposition apparatus according to the disclosure achieves the following technical effects by introducing the adsorption apparatus in the vapor deposition cavity: first, by the magnetic fields produced by the plurality of magnetic blocks comprised by the adsorption apparatus and disposed on a side of the substrate to be vapor deposited away from the metal mask plate, the metal mask plate may be caused to closely fit the substrate to be vapor deposited over it, such that a correct pattern will be formed when sub-pixel units are vapor deposited; second, on that basis, by controlling the height of each magnetic block relative to the substrate to be vapor deposited by the towing apparatus comprised in the adsorption apparatus, the magnetic fields of all the magnetic blocks may be caused to tend to be consistent, avoiding a deformation of the metal mask plate due to the inhomogeneity of the magnetic fields, and thereby avoiding affecting the above-mentioned pattern.

According to an embodiment of the vapor deposition apparatus of the disclosure, the towing apparatus comprises a plurality of adjusting rods disposed over the magnetic blocks and corresponding to the magnetic blocks one to one, which are used for leading the magnetic blocks to move up and down.

According to an embodiment of the vapor deposition apparatus of the disclosure, an individual adjusting rod is connected with a corresponding magnetic block by way of a threaded connection, wherein the surface of the adjusting rod has a screw thread, the magnetic block has a screw hole in relation to the surface of the adjusting rod, and the screw hole matches the screw thread on the surface of the adjusting rod so as to form a threaded connection. In addition, the adjusting rod and the magnetic block may also be connected by other ways, for example, a snap fit, binding, etc.

According to an embodiment of the vapor deposition apparatus of the disclosure, the towing apparatus further comprises a fixing plate for fixing the adjusting rod, wherein the fixing plate has through holes of a number corresponding to that of the adjusting rods and for the adjusting rods to pass through, and the surfaces of the through holes have two opposite grooves; and the surfaces of the adjusting rods have a plurality of pairs of elastic protrusions, and each pair of protrusions match the grooves located on the surfaces of the through hole for fixing an adjusting rod when the adjusting rod passes through a through hole of the fixing plate.

According to an embodiment of the vapor deposition apparatus of the disclosure, the fixing plate is connected with a lifting mechanism fixed on the upper internal surface of the vapor deposition cavity, which lifting mechanism is used for leading the fixing plate to move up and down.

According to an embodiment of the vapor deposition apparatus of the disclosure, the towing apparatus further comprises a controller for controlling any of the adjusting rods to move up and down.

According to an embodiment of the vapor deposition apparatus of the disclosure, the vapor deposition apparatus further comprises a telescopic supporting frame disposed on a side wall of the vapor deposition cavity and an opening disposed at a location where the telescopic supporting frame contacts the vapor deposition cavity, wherein the telescopic supporting frame is telescopic along the direction perpendicular to the side wall of the vapor deposition cavity and used for bearing a separated or replaced magnetic block by extension and transporting the separated or replaced magnetic block out of the vapor deposition cavity through the opening by retraction.

According to an embodiment of the vapor deposition apparatus of the disclosure, the vapor deposition apparatus further comprises a driving apparatus disposed outside the vapor deposition cavity and connected with the telescopic supporting frame, wherein the driving apparatus is used for controlling the extension and retraction of the telescopic supporting frame.

According to an embodiment of the vapor deposition apparatus of the disclosure, the adsorption apparatus further comprises a magnetic block supporting plate for bearing magnetic blocks, and the magnetic block supporting plate may comprise a plurality of movable blocks, wherein the surface area of any of the movable blocks is larger than that of the magnetic block born by the movable block, and the towing apparatus is used for adjusting a magnetic block born by a movable block to move up and down relative to the substrate to be vapor deposited by towing the movable block to move up and down.

According to an embodiment of the vapor deposition apparatus of the disclosure, the towing apparatus comprises towing rods disposed at the four corners of each movable block for leading the movable block to move up and down.

According to another aspect of the disclosure, there is provided a working method for the adsorption apparatus in the vapor deposition apparatus, the method comprising the following steps of:

utilizing the towing apparatus to position all the magnetic blocks in the adsorption apparatus in one and the same horizontal plane, that is, the distances from all the magnetic blocks to the substrate to be vapor deposited are equal;

measuring the magnitude of the magnetic field of each magnetic block by a magnetometer to obtain an initial magnetic field magnitude distribution; and according to the result measured by the magnetometer and a set reference value, utilizing the towing apparatus to respectively regulate the distances from magnetic blocks for which the result is larger or less than the reference value to the substrate to be vapor deposited, such that the magnetic fields of all the magnetic blocks tend to be the reference value.

BRIEF DESCRIPTION OF THE DRAWINGS

In order to more clearly illustrate the technical solutions in the disclosure, the appended drawings corresponding to some embodiments of the disclosure will be introduced briefly in the following. Obviously, the following drawings are only schematic and illustrative, and not necessarily drawn to scale. For those of ordinary skills in the art, other drawings may also be obtained according to these drawings under the premise of not paying out creative work. In addition, for the sake of clarity, structures irrelevant to the disclosure are not drawn in the drawings.

REFERENCE NUMERALS

01 Vapor deposition apparatus; 10 Vapor deposition cavity; 20 Vapor deposition source; 30 Mask plate supporting frame; 40 Substrate supporting frame; 50 Metal mask plate; 60 Substrate to be vapor deposited; 70 Adsorption apparatus; 701 Magnetic block; 702 Towing apparatus; 702a Adjusting rod; 702b Fixing plate; 702a1 Protrusion; 702b1 Through hole; 702c Towing rod; 703 Lifting mechanism; 80 Telescopic supporting frame; 801 Opening; 90 Driving apparatus; 100 Magnetic block supporting plate; 100a Movable block.

DETAILED DESCRIPTION OF THE INVENTION

In the following the technical solutions in embodiments of the disclosure will be described clearly and completely in connection with the drawings in the embodiments of the disclosure. Obviously, the described embodiments are just a part of the embodiments of the disclosure, and not all the embodiments. Based on the embodiments in the disclosure, all the other embodiments obtained by those of ordinary skills in the art under the premise of not paying out creative work pertain to the scope protected by the disclosure.

Figure 1:
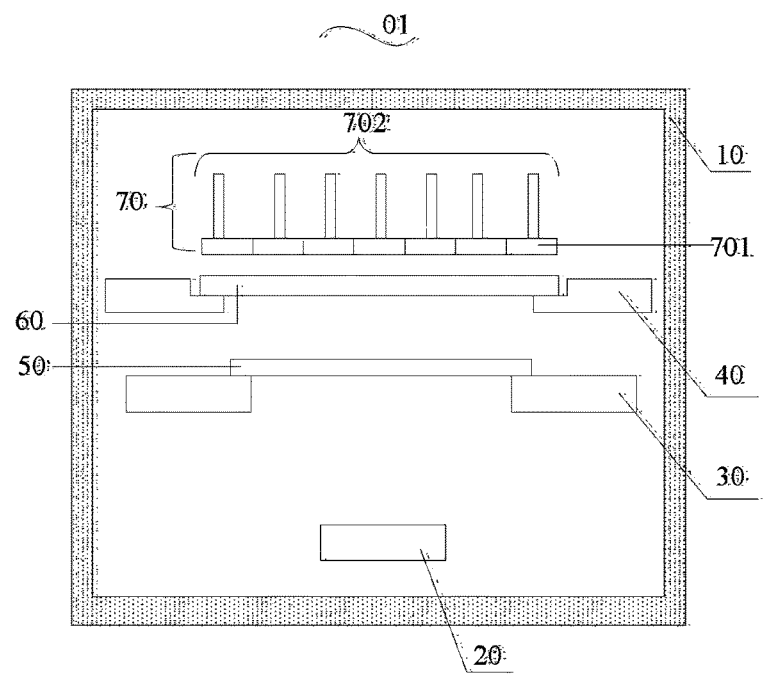
FIG. 1 shows a structural schematic diagram of a vapor deposition apparatus according to a first embodiment of the disclosure.

FIG. 1 shows a structural schematic diagram of a vapor deposition apparatus 01 according to a first embodiment of the disclosure. The vapor deposition apparatus 01 comprises: a vapor deposition cavity 10, a vapor deposition source 20 disposed in the vapor deposition cavity 10, a mask plate supporting frame 30 and a substrate supporting frame 40, the mask plate supporting frame 30 is used for bearing a metal mask plate 50, the substrate supporting frame 40 is used for bearing a substrate 60 to be vapor deposited, and the metal mask plate 50 is disposed between the vapor deposition source 20 and the substrate 60 to be vapor deposited; and further, the vapor deposition apparatus 01 also comprises an adsorption apparatus 70 disposed in the vapor deposition cavity 10. The adsorption apparatus 70 comprises: a plurality of magnetic blocks 701 arranged in a matrix disposed on a side of the substrate 60 to be vapor deposited away from the metal mask plate 50, and a towing apparatus 702 for adjusting each magnetic block to move up and down relative to the substrate 60 to be vapor deposited.

The purpose of disposing magnetic blocks 701 on a side of the substrate 60 to be vapor deposited away from the metal mask plate 50 is that, by the magnetic fields produced by the magnetic blocks, the metal mask plate 50 is caused to closely fit the substrate 60 to be vapor deposited over it, such that a correct pattern will be formed when sub-pixel units are vapor deposited. The purpose of disposing the towing apparatus 702 is that, when these magnetic blocks 701 are in one and the same horizontal plane, there may appear a situation in which the magnetic fields are inhomogeneous, and therefore, by regulating the distances of individual magnetic blocks 701 relative to the substrate 60 to be vapor deposited by the towing apparatus 702, the magnitudes of the magnetic fields of the magnetic blocks 701 may be changed, such that the magnetic fields of all the magnetic blocks 701 tend to be consistent, avoiding a deformation of the metal mask plate 50 due to the inhomogeneity of the magnetic fields, and thereby avoiding affecting the vapor deposited pattern.

As shown in FIG. 1, the vapor deposition source 20 is disposed at the lower part of the vapor deposition cavity 10, and used for outputting a vapor deposition material, e.g., a red light emitting material, a green light emitting material, and a blue light emitting material. Of course, for each sub-pixel unit of an OLED device, in addition to comprising a light emitting layer, it generally further comprises a hole transmission layer disposed between an anode and the light emitting layer, and an electron transmission layer disposed between a cathode and the light emitting layer; in addition, it may further comprise a hole injection layer disposed between the anode and the hole transmission layer, and an electron injection layer disposed between the cathode and the electron transmission layer, and the like; and these functional layers may all obtain corresponding patterns by outputting corresponding materials for vapor deposition by the vapor deposition source 20.

The substrate supporting frame 40 is disposed at the upper part of the vapor deposition cavity 10, and the edges of the substrate 60 to be vapor deposited are located on the substrate supporting frame 40; wherein the substrate 60 to be vapor deposited may comprise a glass substrate and a thin film transistor disposed on the glass substrate and located at each sub-pixel unit, etc., which are determined particularly according to functions of a display to be formed. A vapor deposited substrate or the substrate 60 to be vapor deposited are exchanged via an opening (not shown) disposed on a side wall of the vapor deposition cavity 10, and the opening may be opened and closed by a valve.

The mask plate supporting frame 30 is disposed under the substrate supporting frame 40, and the edges of the metal mask plate 50 are located on the mask plate supporting frame 30.

The towing apparatus 702 may adopt the following way to adjust magnetic blocks to move up and down relative to the substrate 60 to be vapor deposited: all the magnetic blocks 701 may first be caused to be in one and the same horizontal plane, namely, the distances from all the magnetic blocks 701 to the substrate 60 to be vapor deposited are equal; based on this, the magnitude of the magnetic field of each magnetic block 701 may be measured by a magnetometer to obtain an initial magnetic field magnitude distribution; and according to the result of the measured magnetic field magnitudes and a set reference value, the distances from magnetic blocks 701 for which the result is larger or less than the reference value to the substrate 60 to be vapor deposited are regulated respectively: if the measured result is less than the reference value, then the distance from the magnetic block 701 to the substrate 60 to be vapor deposited may be regulated to be smaller, whereas if the measured result is larger than the reference value, then the distance from the magnetic block 701 to the substrate 60 to be vapor deposited may be regulated to be larger. The set reference value is generally an empiric value, or also may be determined according to the result of vapor deposition.

Figure 2:
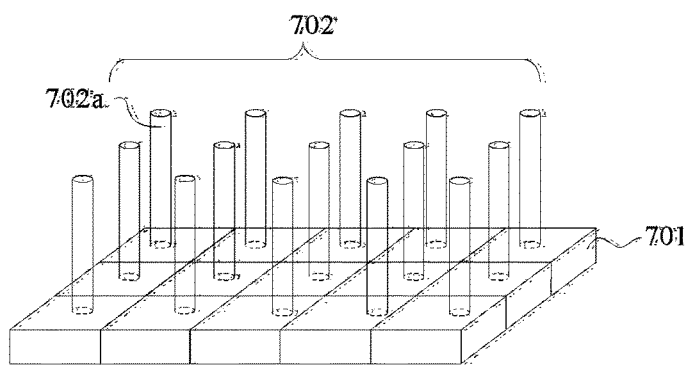
FIG. 2 shows a structural schematic diagram of an adsorption apparatus according to an embodiment of the disclosure.

Particularly, the sizes of all the magnetic blocks 701 may be equal. FIG. 2 shows a structural schematic diagram of an adsorption apparatus 70 according to an embodiment of the disclosure. As shown in FIG. 2, the adsorption apparatus 70 comprises a plurality of magnetic blocks 701 and a towing apparatus 702. The towing apparatus 702 comprises a plurality of adjusting rods 702a disposed over the magnetic blocks 701 and corresponding to the magnetic blocks 701 one to one, which are used for leading the magnetic blocks 701 to move up and down.

In this embodiment, the particular way of the towing apparatus 702 leading the magnetic blocks 701 to move by the adjusting rods 702a is as follows: the lengths of the plurality of adjusting rods 702a for example may be identical, and meanwhile, the initial states of the plurality of adjusting rods 702a may be set to be at one and the same height, and all the magnetic blocks 701 connected with the plurality of adjusting rods 702a are also at the same height, thus, the heights of magnetic blocks 701 for which the magnetic fields are higher or lower than the reference value may be selectively adjusted by corresponding adjusting rods 702a according to the initial magnetic field magnitude distribution obtained by measurement, and whereas there is no need of adjustment for the heights of magnetic blocks 701 for which the magnetic field equals to the reference value.

For example, the number of the magnetic blocks 701 is totally 135 in 27 lines and 5 columns, and when all the magnetic blocks 701 are at the same height, the magnetic field magnitudes of the first 10 lines of magnetic blocks 701 measured by the magnetometer are as shown in the following table:

| | column | | | | |
|---|---|---|---|---|---|
| line | 1 | 2 | 3 | 3 | 5 |
| 1 | 147 | 143 | 139 | 141 | 130 |
| 2 | 93 | 91 | 85 | 88 | 77 |
| 3 | 78 | 76 | 74 | 78 | 65 |
| 4 | 98 | 95 | 90 | 87 | 82 |
| 5 | 76 | 79 | 81 | 73 | 67 |
| 6 | 107 | 90 | 84 | 85 | 81 |
| 7 | 78 | 89 | 79 | 85 | 73 |
| 8 | 92 | 89 | 77 | 82 | 82 |
| 9 | 89 | 85 | 86 | 85 | 80 |
| 10 | 90 | 87 | 75 | 94 | 81 |

In such a case, when the reference magnetic field magnitude is set to be 80 T, the heights of individual magnetic blocks 701 for which the magnitudes are larger than 80 T and less than 80 T or the distances of them relative to the substrate 60 to be vapor deposited may be adjusted by adjusting rods 702a, such that the magnitudes of the magnetic fields of all the magnetic blocks 701 tend to be 80 T.

The towing apparatus 702 may further comprise a controller for controlling any of the adjusting rods 702a to move up and down. That is, by an external force applied on an adjusting rod 702a by the controller, the adjusting rod 702a may be led to move up and down relative to the substrate 60 to be vapor deposited, thereby achieving the purpose of moving a magnetic block 701 connected with the adjusting rod 702a.

Figure 3:
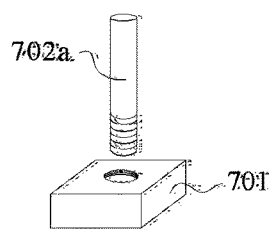
FIG. 3 shows a structural schematic diagram of a connection of an adjusting rod with a magnetic block in an adsorption apparatus according to an embodiment of the disclosure.

FIG. 3 shows a structural schematic diagram of a connection of an adjusting rod 702a with a magnetic block 701 according to an embodiment of the disclosure. For example, the adjusting rod 702a may be connected with the magnetic block 701 by way of a threaded connection. As shown in FIG. 3, the surface of the adjusting rod 702a has a screw thread; and the surface of the magnetic block 701 facing to the adjusting rod 702a has a screw hole, and the screw hole matches the screw thread on the surface of the adjusting rod 702a, such that both may form a threaded connection. Of course, they may also be connected employing any other appropriate way, for example, a snap fit connection, binding, etc.

Thus, in a case of an adjusting rod 702a being connected with a magnetic block 701 by way of a threaded connection as shown in FIG. 3, an adjusting rod 702a may be conveniently connected with a corresponding magnetic block 701 by rotating each adjusting rod 702a. Therein, in a case of the lengths of the adjusting rods 702a being identical and their heights being consistent, each magnetic block 701 may be caused also to be at the same height by controlling each adjusting rod 702a to rotate the same number of turns, and based on this, if the height of a certain magnetic block 701 is to be regulated, it may suffice to directly adjust the adjusting rod 702a to rise or fall a certain height.

Figure 4:
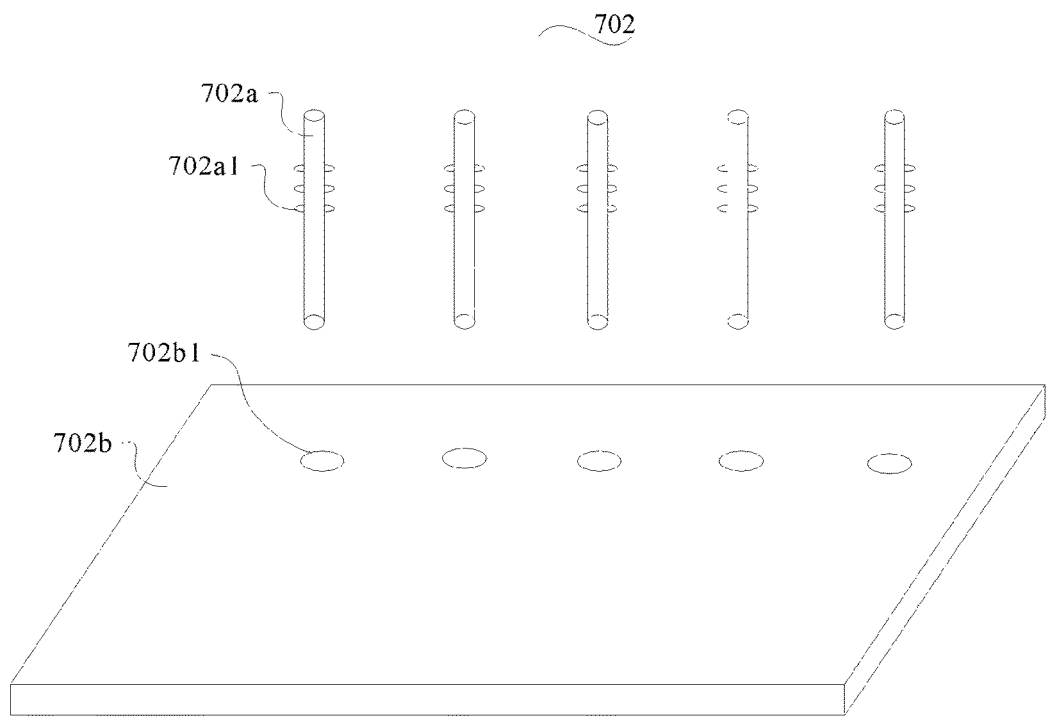
FIG. 4 shows a structural schematic diagram of a towing apparatus according to an embodiment of the disclosure.

FIG. 4 shows a structural schematic diagram of a towing apparatus 702 according to another embodiment of the disclosure. As compared to FIG. 2, the towing apparatus 702 as shown in FIG. 4 further comprises a fixing plate 702b for fixing adjusting rods 702a. As shown in FIG. 4, the fixing plate 702b has through holes 702b1 of a number corresponding to that of the adjusting rods 702a and the surfaces of the through holes 702b1 have two opposite grooves (not shown); the adjusting rods 702a may pass through the through holes 702b1, and in the height direction of the adjusting rods 702a, the surfaces of the adjusting rods 702a have a plurality of pairs of elastic protrusions 702a1, and each pair of protrusions 702a1 match the grooves located on the surfaces of the through hole 702b1. As such, when the adjusting rods 702a pass into the through holes 702b1 of the fixing plate 702b, the adjusting rods 702a may be fixed on the fixing plate 702b by the grooves on the through holes 702b1 and the protrusions 702a1 on the adjusting rods 702a, and will not drift left and right. Based on this, since the protrusions 702a1 are elastic, when an adjusting rod 702a is pushed and pulled by an external force, a pair of protrusions 702a1 originally located within grooves may move up or down relative to the grooves with the application of the external force, and when the adjusting rod 702a moves to a certain location, the location of the adjusting rod 702a at this time may be fixed by another pair of protrusions 702a1 at the same location as the grooves.

It needs to be noted that, a part of an elastic protrusion 702a1 here may be embedded in the adjusting rod 702a, and when extruded by an external force, the elastic protrusion 702a1 may be extruded into the adjusting rod 702a, thereby ensuring that the adjusting rod 702a may move relative to a through hole 702b1 of the fixing plate 702b.

Figure 5:
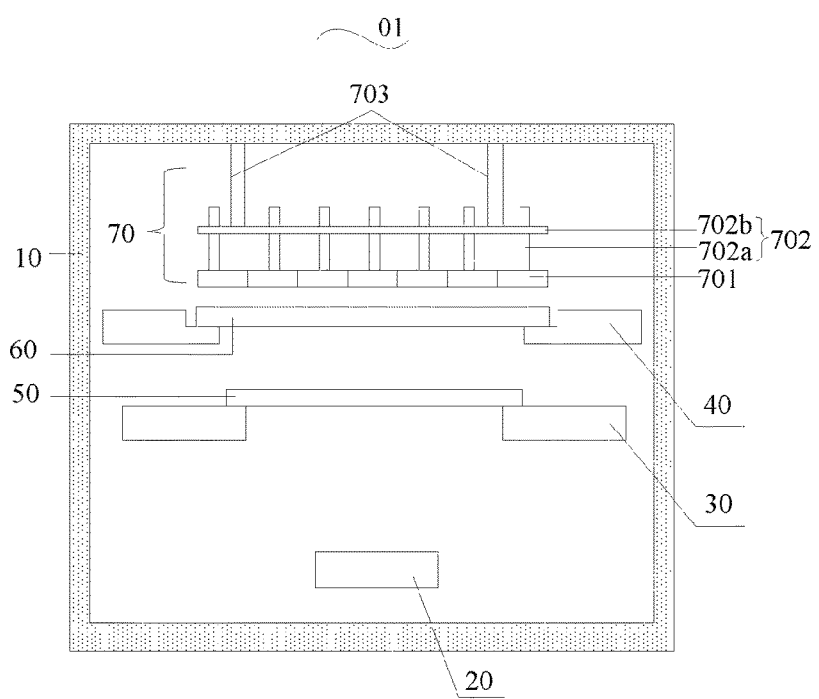
FIG. 5 shows a structural schematic diagram of a vapor deposition apparatus according to a second embodiment of the disclosure.

FIG. 5 shows a structural schematic diagram of a vapor deposition apparatus 01 according to a second embodiment of the disclosure. The vapor deposition apparatus 01 as shown in FIG. 5 is similar to the vapor deposition apparatus 01 as shown in FIG. 1, and the difference lies in that, the vapor deposition apparatus 01 as shown in FIG. 5 comprises the fixing plate 702b as shown in FIG. 4, which is connected with a lifting mechanism 703 fixed on the upper internal surface of the vapor deposition cavity 10, which lifting mechanism 703 is used for leading the fixing plate 702b to move up and down. Consequently, the fixing plate 702b may be led to be at an appropriate location by the lifting mechanism 703, such that all the magnetic blocks 701 connected with the adjusting rods 702a fixed on the fixing plate 702b are at an appropriate initial location. Based on this, the height of a magnetic block 701 is adjusted by regulating the height of an adjusting rod 702a.

Figure 6:
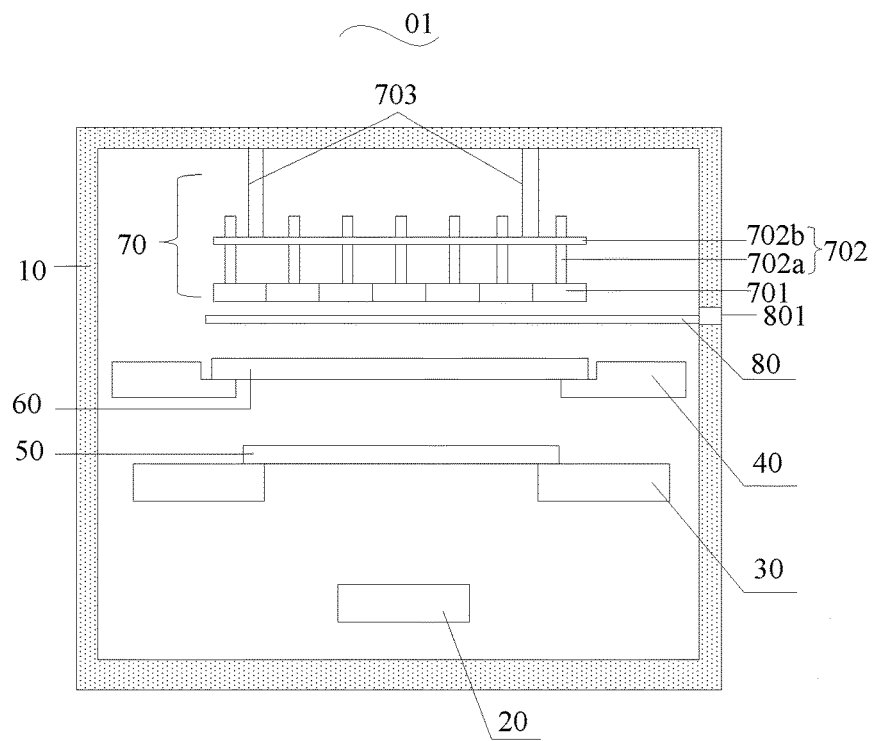
FIG. 6 shows a structural schematic diagram of a vapor deposition apparatus according to a third embodiment of the disclosure.

FIG. 6 shows a structural schematic diagram of a vapor deposition apparatus 01 according to a third embodiment of the disclosure. As compared to FIG. 5, the vapor deposition apparatus 01 as shown in FIG. 6 further comprises a telescopic supporting frame 80 disposed on a side wall of the vapor deposition cavity 10, and the telescopic supporting frame 80 may be telescopic along the direction perpendicular to the side wall of the vapor deposition cavity 10.

Thus, when it is needed to separate a magnetic block 701 from an adjusting rod 702a or replace a magnetic block 701, the separated or replaced magnetic block 701 may be born by controlling the telescopic supporting frame 80 to extend to arrive a corresponding location. Then, by an opening 801 disposed at a location where the telescopic supporting frame 80 contacts the vapor deposition cavity 10, and then by controlling the telescopic supporting frame 80 to retract, the separated or replaced magnetic block 701 may be transported out of the vapor deposition cavity 10 through the opening 801. The opening 801 may be opened and closed by a valve.

Figure 7:
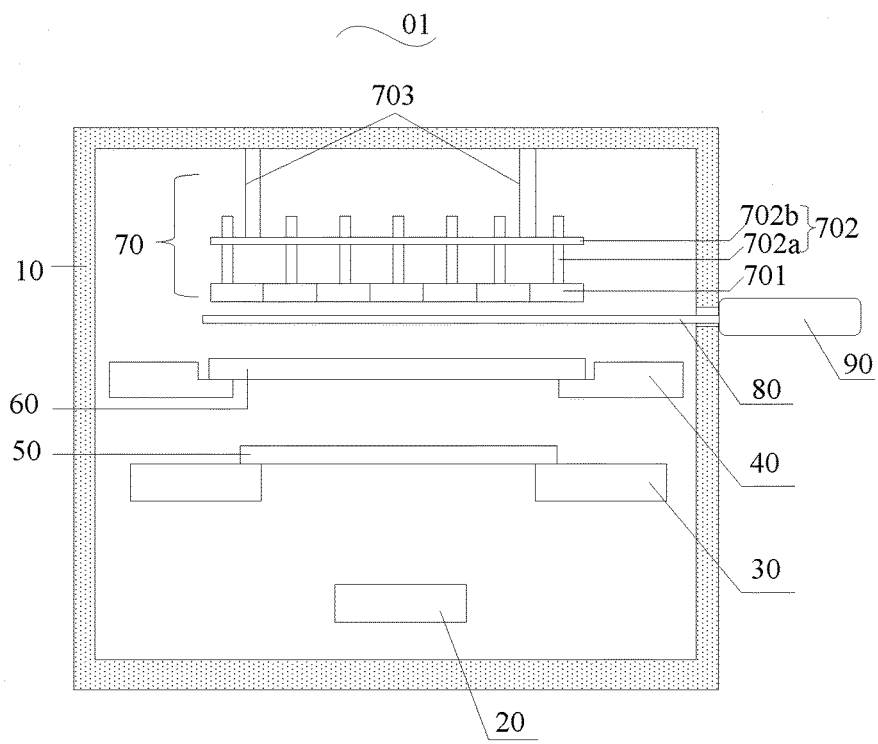
FIG. 7 shows a structural schematic diagram of a vapor deposition apparatus according to a fourth embodiment of the disclosure.

FIG. 7 shows a structural schematic diagram of a vapor deposition apparatus 01 according to a fourth embodiment of the disclosure. As compared to FIG. 6, the vapor deposition apparatus 01 as shown in FIG. 7 further comprises a driving apparatus 90 disposed outside the vapor deposition cavity 10 and connected with the telescopic supporting frame 80, and the driving apparatus 90 is used for controlling the extension and retraction of the telescopic supporting frame 80.

Figure 8:
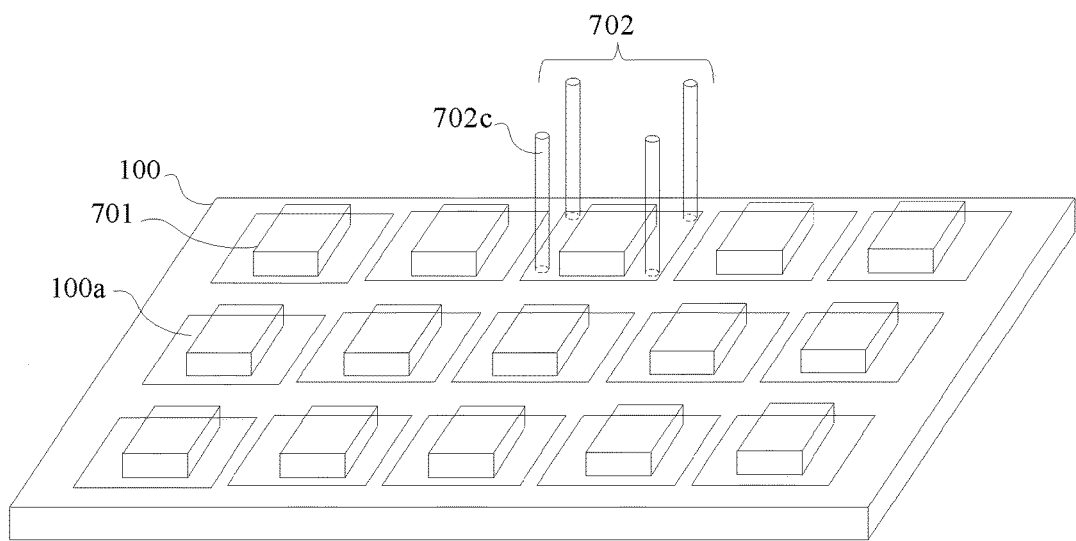
FIG. 8 shows a structural schematic diagram of an adsorption apparatus according to another embodiment of the disclosure.

FIG. 8 shows a structural schematic diagram of an adsorption apparatus 70 according to another embodiment of the disclosure. Similar to FIG. 2, the adsorption apparatus as shown in FIG. 8 also comprises a towing apparatus 702 and magnetic blocks 701. In addition, the adsorption apparatus as shown in FIG. 8 further comprises a magnetic block supporting plate 100 for bearing magnetic blocks 701, wherein the magnetic block supporting plate 100 comprises a plurality of movable blocks 100a, and the surface area of any of the movable blocks 100a is larger than that of the magnetic block 701 born by the movable block 100a. In such a case, the towing apparatus 702 may tow any of the movable blocks 100a to move up and down relative to the substrate 60 to be vapor deposited, thereby achieving that a magnetic block 701 born by the movable block 100a moves up and down relative to the substrate 60 to be vapor deposited.

Thus, when all the movable blocks 100a are at one and the same horizontal location, an initial magnetic field magnitude distribution is obtained by measuring the magnitudes of the magnetic fields of all the magnetic blocks 701 in this state, and then the heights of magnetic blocks 701 for which the magnetic fields are higher or lower than the reference value are selectively adjusted by controlling each movable block 100a by the towing apparatus 702, and whereas there is no need of adjustment for the heights of magnetic blocks 701 for which the magnetic field equals to the reference value.

Further, as shown in FIG. 8, the towing apparatus 702 may comprise towing rods 702c disposed at the four corners of each movable block 100a for leading the movable block 100a to move up and down.

The vapor deposition apparatus 01 may further comprise a control apparatus (not shown) connected with the towing rods 702c for controlling the movement of the towing rods 702c. Thus, when the height of a certain magnetic block 701 needs to be adjusted, by controlling the towing rods 702c at the four corner of a movable block 100a in contact with the magnetic block 701, the magnetic block 701 may be led to move up and down by the movement of the movable block 100a.

As compared to the adsorption apparatus 70 as shown in FIG. 2, the adsorption apparatus 70 in the embodiment as shown in FIG. 8 makes the process of the towing apparatus 702 moving a magnetic block up and down more stable and more accurate by adding a magnetic block supporting plate 100, movable blocks 100a and changing one adjusting rod 702b corresponding to one magnetic block into four towing rods 702c corresponding to one magnetic block.

What are described above are just specific embodiments of the disclosure, however, the protection scope of the disclosure is not limited thereto, and variations or alternatives easily occurring to any artisan familiar with the technical field within the technical scope disclosed by the disclosure should be encompassed within the protection scope of the disclosure. Therefore, the protection scope of the disclosure should be subject to the protection scope of the claims.

The invention claimed is:

1. A vapor deposition apparatus comprising: a vapor deposition cavity, a vapor deposition source disposed in the vapor deposition cavity, a mask plate supporting frame and a substrate supporting frame, wherein the mask plate supporting frame is used for bearing a metal mask plate, the substrate supporting frame is used for bearing a substrate to be vapor deposited, and the metal mask plate is disposed between the vapor deposition source and the substrate to be vapor deposited, wherein the vapor deposition apparatus further comprises an adsorption apparatus disposed in the vapor deposition cavity, the adsorption apparatus comprising: a plurality of magnetic blocks arranged in a matrix disposed on a side of the substrate to be vapor deposited away from the metal mask plate; a magnetic block supporting plate for bearing the magnetic blocks, the magnetic block supporting plate comprising a plurality of movable blocks, with each movable block bearing a corresponding magnetic block, wherein the surface area of any of the movable blocks is larger than that of the corresponding magnetic block born by the movable block; and a towing apparatus for adjusting the plurality of magnetic blocks born by the plurality of movable blocks to move up and down relative to the substrate to be vapor deposited by towing the plurality of movable blocks to move up and down, wherein the towing apparatus comprises a plurality of towing rods disposed at four corners of each of the plurality of movable blocks for leading the magnetic blocks to move up and down.

2. The vapor deposition apparatus as claimed in claim 1, wherein an individual towing rod is connected with a corresponding movable block by way of a threaded connection or a snap fit connection.

3. The vapor deposition apparatus as claimed in claim 1, wherein the towing apparatus further comprises a fixing plate for fixing the towing rods, wherein the fixing plate has through holes of a number corresponding to that of the towing rods and for the towing rods to pass through, and the surfaces of the through holes have two opposite grooves; and the surfaces of the towing rods have a plurality of pairs of elastic protrusions, and each pair of protrusions match the grooves located on the surfaces of the through hole for fixing an towing rod when the towing rod passes through a through hole of the fixing plate.

4. The vapor deposition apparatus as claimed in claim 3, wherein, the adsorption apparatus further comprises a lifting mechanism fixed on the upper internal surface of the vapor deposition cavity, which is used for leading the fixing plate to move up and down by connecting with the fixing plate.

5. The vapor deposition apparatus as claimed in claim 1, wherein the towing apparatus further comprises a controller for controlling the towing rods to move up and down.

6. The vapor deposition apparatus as claimed in claim 1, wherein the vapor deposition apparatus further comprises a telescopic supporting frame disposed on a side wall of the vapor deposition cavity and an opening disposed at a location where the telescopic supporting frame contacts the vapor deposition cavity, wherein the telescopic supporting frame is telescopic along the direction perpendicular to the side wall of the vapor deposition cavity and used for bearing a separated or replaced magnetic block by extension and transporting the separated or replaced magnetic block out of the vapor deposition cavity through the opening by retraction.

7. The vapor deposition apparatus as claimed in claim 6, wherein the vapor deposition apparatus further comprises a driving apparatus disposed outside the vapor deposition cavity and connected with the telescopic supporting frame, and the driving apparatus is used for controlling the extension and retraction of the telescopic supporting frame.

8. A working method for the adsorption apparatus in the vapor deposition apparatus as claimed in claim 1, the method comprising the following steps of:

utilizing the towing apparatus to position all the magnetic blocks in the adsorption apparatus in one and the same horizontal plane, that is, the distances from all the magnetic blocks to the substrate to be vapor deposited are equal;

measuring the magnitude of the magnetic field of each magnetic block by a magnetometer to obtain an initial magnetic field magnitude distribution; and according to the result measured by the magnetometer and a set reference value, utilizing the towing apparatus to respectively regulate the distances from magnetic blocks for which the result is larger or less than the reference value to the substrate to be vapor deposited, such that the magnetic fields of all the magnetic blocks tend to be the reference value.

* * * * *